United States Patent [19]
Okumura

[11] Patent Number: 5,433,369
[45] Date of Patent: Jul. 18, 1995

[54] WIRE BONDING APPARATUS AND METHOD

[75] Inventor: Hiroshi Okumura, Kyoto, Japan

[73] Assignee: Rohm Co., Ltd., Japan

[21] Appl. No.: 183,420

[22] Filed: Jan. 19, 1994

[30] Foreign Application Priority Data

Jan. 19, 1993 [JP] Japan ................... 5-006488

[51] Int. Cl.⁶ ............... H01L 21/607; B23K 20/10
[52] U.S. Cl. ................... 228/110.1; 228/102; 228/1.1; 228/8
[58] Field of Search ............... 228/102, 110.1, 111, 228/180.5, 1.1, 4.5, 8

[56] References Cited

U.S. PATENT DOCUMENTS

| | | | |
|---|---|---|---|
| 4,341,574 | 7/1982 | Landes | 228/110.1 |
| 4,808,948 | 2/1989 | Patel et al. | 228/1.1 |
| 4,824,005 | 4/1989 | Smith, Jr. | 228/1.1 |
| 5,044,543 | 9/1991 | Yamazaki et al. | 228/1.1 |
| 5,046,654 | 9/1991 | Yamazaki et al. | 228/1.1 |
| 5,176,311 | 1/1993 | Levine et al. | 228/4.5 |
| 5,213,249 | 5/1993 | Long et al. | 228/1.1 |
| 5,238,173 | 8/1993 | Ura et al. | 228/4.5 |

OTHER PUBLICATIONS

Semicon NEWS, Feb. 1990, p. 80, "High Speed Wire Bonding Apparatus Acceptable for Multi-pin System" by Takaji Tsujimura.

*Primary Examiner*—Samuel M. Heinrich
*Attorney, Agent, or Firm*—Dickstein, Shapiro & Morin

[57] ABSTRACT

A wire bonding apparatus realizing stable bonding by supplying a constant electric power to a joint. Under loadless conditions, an electric-power calculation circuit calculates the power supply from a feedback current and oscillating voltage corresponding to a level setting signal set to a level change circuit. When the tip of a bonding wire contacts a bond electrode, the feedback current gets smaller than that under loadless conditions and the power supply decreases. The electric-power calculation circuit calculates the power supply from the feedback current and oscillating voltage and a correction circuit outputs a control voltage for complementing a decrease of power supply accumulated since the loadless state. A level change circuit converts an oscillating voltage into a level corresponding to the control voltage. Thereby, the electric power to be supplied to the joint is kept constant. A PLL circuit controls an oscillator so that the phase of the oscillated output coincides with that of the feedback current to prevent the electric power from decreasing due to the phase difference between the output and the current.

10 Claims, 3 Drawing Sheets

WIRE BONDING APPARATUS AND METHOD

BACKGROUND OF THE INVENTION (i) Field of the Invention

The present invention relates to a semiconductor manufacturing equipment, particularly to a wire bonding apparatus and method using at least ultrasonic energy as bonding means.

(ii) Description of the Prior Art

One of the many assembly processes for manufacturing a semiconductor device is what is known as the wire bonding process for connecting an electric terminal on a semiconductor chip with a lead terminal on a package of a lead frame or the like by a thin metallic wire. In this process, an end of the thin metallic wire is pressed against a bonding pad to bond it. The bonding is frequently performed by the ultrasonic method or ultrasonic thermocompression bonding method in addition to the thermocompression bonding method. A wire bonding apparatus and bonding process according to a general ultrasonic thermocompression bonding method are described below by referring to FIGS. 2 and 3.

As shown in FIG. 2, this type of wire bonding apparatus comprises an ultrasonic unit 31 for oscillation-controlling a high-frequency voltage, an ultrasonic vibrator 15 which is vibrated by a high-frequency voltage 24 supplied from the ultrasonic unit 31, a tool horn 32 for transmitting ultrasonic energy supplied from the ultrasonic vibrator 15, and a capillary 33 for transmitting ultrasonic energy to a thin metallic wire (hereafter referred to as a wire) 38 while guiding the wire 38. The tool horn 32 and capillary 33 move together vertically and horizontally so that an end of the wire 38 is accurately positioned on a bonding pad 36 of a semiconductor chip 35 to be bonded.

Steps of performing bonding according to a bonding method generally called ball stitch bonding by using the ultrasonic wire bonding apparatus with the above constitution are described below by referring to FIG. 3.

(1) An electric torch 51 is brought close to an end of the wire 38 to cause an electric discharge and to form a ball at the end of the wire 38 [FIG. 3(a)].

(2) When a ball 54 is formed, the electric torch 51 is moved to the original position [FIG. 3(b)].

(3) The capillary 33 is lowered, the ball 54 is made to contact a first bond electrode (chip pad) 36, and bonding is performed by crushing the ball with the end of the capillary 33 by means of pressure, heat, and ultrasonic energy [FIG. 3(c)].

(4) The capillary 33 is moved above a second bond electrode 58 and lowered. In this case, the wire 38 is sent out of the end of the capillary 33 to form a loop [FIG. 3(d)].

(5) The wire 38 is bonded with the second bond electrode 58 by means of pressure, heat, and ultrasonic energy and thereafter the capillary 33 is raised. Then, a clamp 56 is closed at a predetermined rising position and thereby a tension is applied to a joint and the wire 38 is cut [FIG. 3(e)].

In general, the wire 38 uses Au (gold), the chip pad (first bond electrode 36) uses Al (aluminum), and the lead frame electrode (second bond electrode 58) uses Ag (silver).

In the above steps, a mechanical contact resistance when the ball is bonded with the chip pad by the capillary (that is, load for ultrasonic vibration) is not always constant but it changes depending on, for example, the surface state of the pad, fusing characteristic of die bonding, or state of lead pressed. Therefore, a constant electric power is not transmitted to the joint due to a change of the load. Thus, ball removal due to incomplete bonding (or removal of the joint) may occur. To avoid the above trouble, it is necessary to enhance the bonding by supplying sufficient electric power. In this case, however, high density is difficult to obtain because a problem occurs that an extremely-crushed ball protrudes and contacts an adjacent pad.

The present invention is made to solve the above problem and its object is to provide a wire bonding apparatus realizing stable bonding by supplying a constant electric power to a joint.

SUMMARY OF THE INVENTION

The wire bonding apparatus of a mode of the present invention is a wire bonding apparatus for bonding a bonding wire to a bond electrode by using at least ultrasonic vibration, comprising an oscillator for outputting a high-frequency voltage, an ultrasonic vibrator driven by the high-frequency voltage, electric power detection means for detecting a decrease of power supply due to contact between the bonding wire and the electrode by detecting a feedback current outputted from the ultrasonic vibrator, and level change means for changing high-frequency voltage levels outputted from the oscillator so as to complement the decrease of power supply detected by the electric power detection means.

For the wire bonding apparatus, a decrease of power supply due to contact between the bonding wire and electrode is detected and high-frequency voltage levels outputted from the oscillator change so as to complement the decrease. Thereby, a constant electric power is supplied to the joint.

The wire bonding apparatus of another mode of the present invention is further provided with phase difference control means for adjusting a phase difference between the feedback current and the high-frequency voltage to zero.

For the wire bonding apparatus, adjustment is performed so that a phase difference between the feedback current outputted from the ultrasonic vibrator and the high-frequency voltage comes to zero and the efficiency of the electric power supply is prevented from decreasing.

DESCRIPTION OF THE PREFERRED EMBODIMENT

The present invention will be described in detail in accordance with an embodiment.

Figure 1:
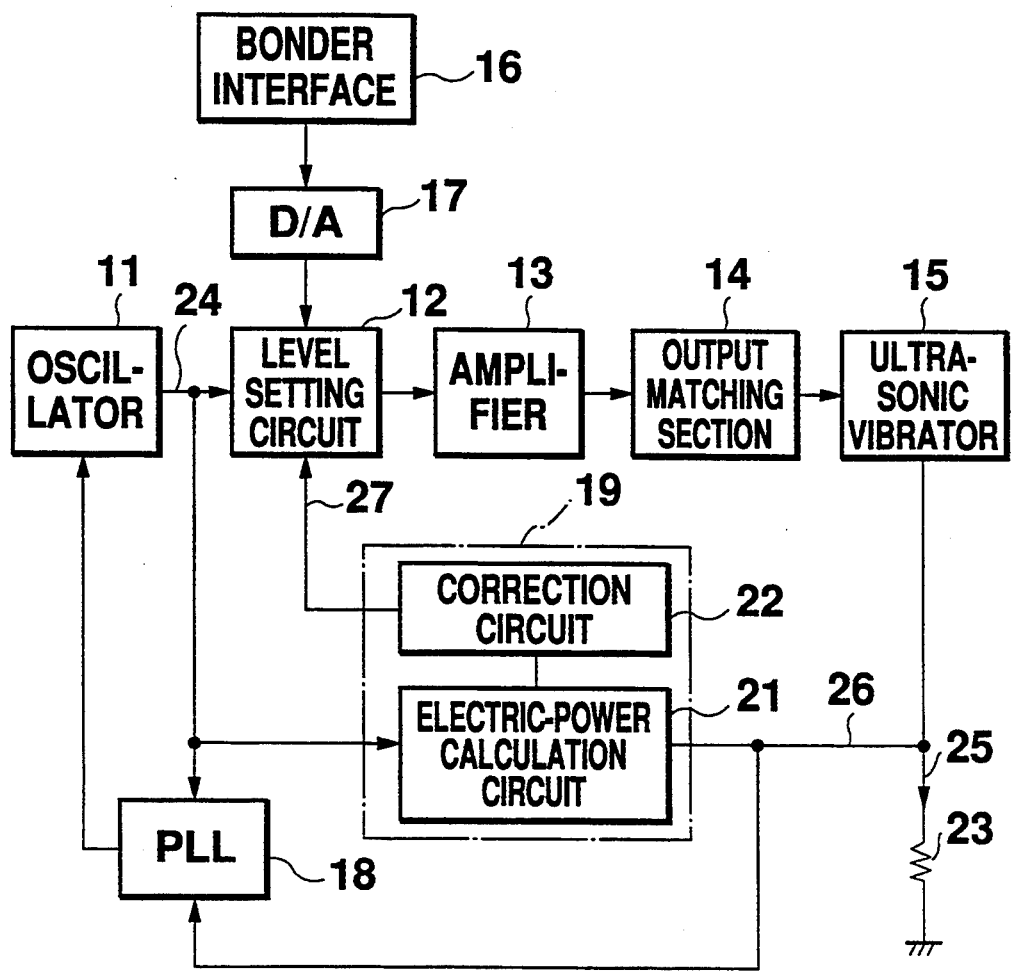
FIG. 1 is a block diagram showing an important section of the wire bonding apparatus of an embodiment of the present invention.
Figure 2:
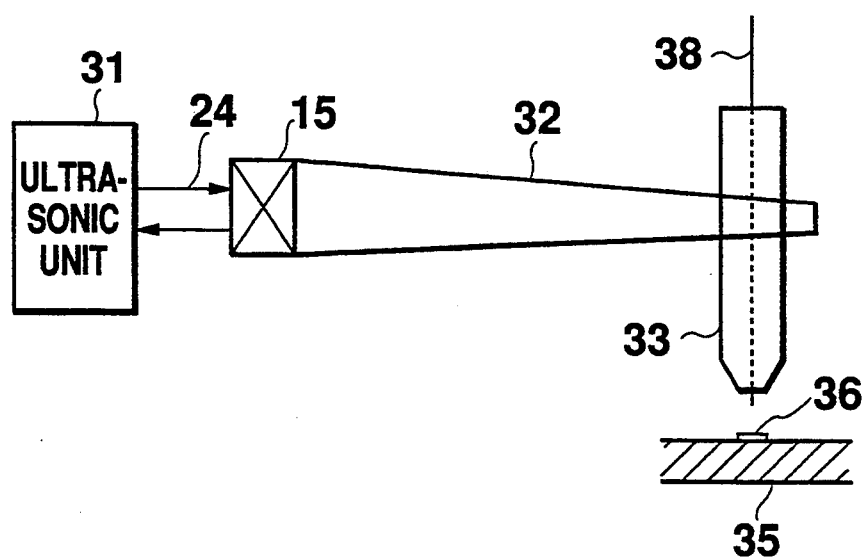
FIG. 2 is an illustration showing the overall constitution of a general ultrasonic wiring bonding apparatus.

FIG. 1 shows an important part of the wire bonding apparatus of an embodiment of the present invention. However, the description of the overall constitution of the apparatus is omitted because the overall constitution the same as that shown in FIG. 2

The apparatus shown in FIG. 1 is provided with an oscillator 11, and an oscillating voltage 24 output by the oscillator is inputted to a level setting circuit 12, PLL (phase lock loop) circuit 18, and an electric power calculation circuit 21 of an electric power control circuit 19 to be described later. A digital level-setting signal given through a bonder interface 16 is converted into an analog signal by a digital-analog converter (D/A converter) 17 and inputted to the level setting circuit 12. Output levels of the oscillator 11 are changed according to the level setting signal. The level setting circuit 12 is also controlled by a correction circuit 22 of the electric power control circuit 19 to be described later.

An output of the level setting circuit 12 is amplified by an amplifier 13 at a finite width, waveform-shaped by an output matching device 14, and thereafter supplied to the ultrasonic vibrator 15. The ultrasonic vibrator 15 vibrates according to the supplied high-frequency voltage and the thus generated ultrasonic vibration energy is transmitted to the wire 38 through the tool horn 32 and capillary 33.

A feedback-current detection resistance 23 for detecting a feedback current is connected between the ultrasonic vibrator 15 and ground, and a voltage corresponding to a feedback current 25 (hereafter referred to as feedback-current indication voltage) is generated at one end of the resistance 23. The feedback-current indication voltage 26 is inputted to the electric-power calculation circuit 21 of the electric-power control section 19 and the PLL circuit 18. The electric-power calculation circuit 21 calculates electric power from the feedback current 25 obtained from the feedback-current indication voltage 26 and the oscillating voltage 24 output by the oscillator 11 and inputs the calculated electric power to the correction circuit 22. The correction circuit 22 inputs a control voltage 27 for compensating the calculated electric power value to the level setting circuit 12 in correspondence with the calculated electric power value.

On the other hand, the PLL circuit 18 controls the oscillator 11 according to the oscillated output 24 from the oscillator 11 and the feedback-current indication voltage 26 so that the frequency and phase of the output 24 coincide with those of the voltage 26.

Figure 3:
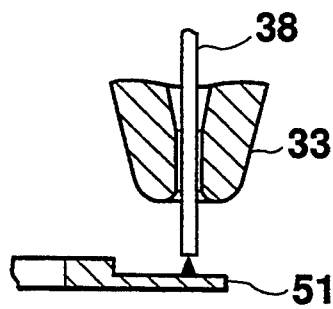
FIG. 3(a) is an illustration showing a bonding process using a general ultrasonic wire bonding apparatus.
FIG. 3(b) is an illustration showing a bonding process using a general ultrasonic wire bonding apparatus.
FIG. 3(c) is an illustration showing a bonding process using a general ultrasonic wire bonding apparatus.
FIG. 3(d) is an illustration showing a bonding process using a general ultrasonic wire bonding apparatus.
FIG. 3(e) is an illustration showing a bonding process using a general ultrasonic wire bonding apparatus.
Figure 3:
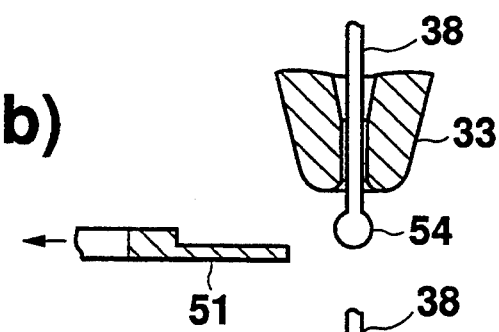
Figure 3:
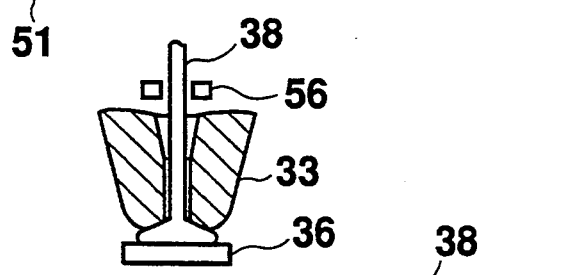
Figure 3:
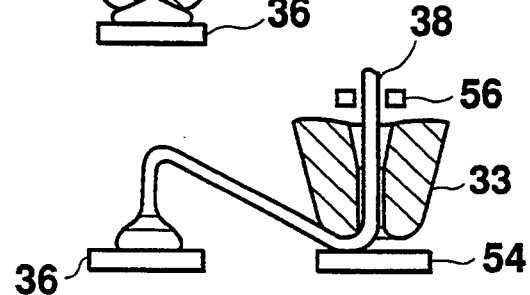
Figure 3:
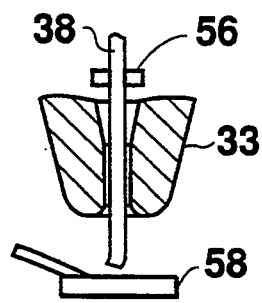

Operations of a wire bonding apparatus with the above constitution will be described below in reference to FIG. 3. When the level setting circuit 12 sets a level corresponding to a level setting signal given from the bonder interface 16 under a state in which a ball 54 at the tip of the wire 38 (FIG. 3) does not contact a bonding pad (that is, a loadless state), the ultrasonic vibrator 15 vibrates with the ultrasonic energy corresponding to the set level. The electric-power calculation circuit 21 calculates electric power from the feedback current 25 and oscillated voltage 24, and the correction circuit 22 holds the calculated electric power as a loadless impedance.

Next, when the capillary 33 (FIG. 3) is lowered and the ball 54 contacts the first bond electrode 36, the feedback current gets smaller than that under the loadless state due to its contact resistance and the power supply decreases. The electric-power calculation circuit 21 calculates power supply from the feedback current 25 and oscillated voltage 24 to give the power supply to the correction circuit 22. The correction circuit 22 outputs the control voltage 27 for complementing the decrease of power supply. The level setting circuit 12 receiving the voltage 27 converts the oscillated voltage 24 into a level corresponding to the control voltage 27 to output it. Therefore, the electric power to be supplied to the joint is kept constant.

At the same time, the PLL circuit 18 controls the oscillator 11 according to the oscillated output 24 and feedback-current indication voltage 26 so that the frequency and phase of the output 24 coincide with those of the voltage 26. Thus, it is possible to prevent the electric power from decreasing due to the phase difference between voltage and current.

By repeatedly performing the above control, feedback control is performed so that the electric power to be supplied to the joint is kept constant, even if the ball 54 is crushed and the bonding resistance increases.

In this connection, the description of the above operation relates to bonding of the ball with the first bond electrode. This operation, however, is also performed when the ball is bonded with the second bond electrode 8 and thereby stable bonding is realized.

For this embodiment, the compressing bonding method is described only for ultrasonic waves. However, it is also possible to perform ultrasonic thermocompression bonding by using a heater for heating a joint.

As described above, the present invention makes it possible to monitor the power supply to a joint and perform feedback control so that the power supply is kept constant. Therefore, stable bonding Is performed independently of the contact state between a bonding wire and an electrode. Therefore, there is an advantage that high integration level mounting is easily realized because imperfect bonding such as ball removal does not occur or an extremely crushed ball can be prevented even if the minimum power supply is set.

What is claimed is:

1. A wire bonding apparatus for bonding a bonding wire with a bond electrode by using at least ultrasonic vibration, comprising:
    an oscillator for outputting a high-frequency voltage;
    an ultrasonic vibrator driven by the high-frequency voltage;
    electric power detection means for detecting a decrease of power supply due to contact between the bonding wire and the electrode by detecting a feedback current outputted from the ultrasonic vibrator; and
    level change means for changing high-frequency voltage levels outputted from the oscillator so as to complement the decrease of power supply detected by the electric power detection means.

2. The wire bonding apparatus according to claim 1 further comprising phase difference control means for adjusting a phase difference between the feedback current and the high-frequency voltage to zero.

3. The wire bonding apparatus according to claim 1 or 2 further comprising second level change means for changing the high-frequency voltage levels outputted from the oscillator in accordance with external manual setting.

4. The wire bonding apparatus according to claim 2 wherein the phase difference control means comprises a PLL (phase lock loop) circuit.

5. The wire bonding apparatus according to claim 1 or 2 further comprising heating means for heating a joint between a bonding wire and a bond electrode.

6. A wire bonding method for bonding a bonding wire with a bond electrode by using at least ultrasonic vibration, comprising the step of:

changing high-frequency voltage levels outputted from an oscillator so as to complement the decrease of electric power detected by an electric power detection means by using an oscillator for outputting a high-frequency voltage, an ultrasonic vibrator driven by the high-frequency voltage, and an electric-power detection means for detecting a decrease of power supply due to contact between the bonding wire and the bond electrode by detecting a feedback current outputted from the ultrasonic vibrator.

7. The wire bonding method according to claim 6, further comprising a step of adjusting the phase difference between the feedback current and the high-frequency voltage to zero.

8. The wire bonding method according to claim 6 or 7, further comprising a step of changing the high-frequency voltage levels outputted from the oscillator through external manual setting.

9. The wire bonding method according to claim 7, further comprising a step of adjusting the phase difference between the feeback current and the high-frequency voltage by a PLL (phase lock loop) circuit.

10. The wire bonding method according to claim 6 or 7, further comprising a step of heating a joint between a bonding wire and a bond electrode.

* * * * *